US006317357B1

(12) United States Patent
Forbes

(10) Patent No.: US 6,317,357 B1
(45) Date of Patent: Nov. 13, 2001

(54) VERTICAL BIPOLAR READ ACCESS FOR LOW VOLTAGE MEMORY CELL

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/328,074

(22) Filed: May 8, 1999

Related U.S. Application Data

(63) Continuation of application No. 09/028,249, filed on Feb. 24, 1998, now Pat. No. 5,963,469.

(51) Int. Cl.[7] .................................................. G11C 11/24
(52) U.S. Cl. ........................ 365/149; 365/177; 257/302
(58) Field of Search .................................. 365/149, 177, 365/225.6; 257/70, 302, 305; 438/202, 234

(56) References Cited

U.S. PATENT DOCUMENTS

| 3,657,575 | 4/1972 | Taniguchi et al. ................ 307/304 |
| 3,806,741 | 4/1974 | Smith ................................ 307/304 |
| 3,931,617 | 1/1976 | Russell ............................ 340/173 R |

(List continued on next page.)

FOREIGN PATENT DOCUMENTS 363066963A  3/1988  (JP) ........................... 257/305

OTHER PUBLICATIONS

Chen, M.J., et al., "Back–Gate Forward Bias Method for Low–Voltage CMOS Digital Circuits", *IEEE Transactions on Electron Devices,* 43, 904–909, (Jun. 1996).

Forbes, L., et al., "Resonant Forward–Biased Guard–Ring Diodes for Suppression of Substrate Noise in Mixed–Mode CMOS Circuits", *Electronics Letters,* 31, 720–721, (Apr. 1995).

Foster, R., et al., ,"High Rate Low–Temperature Selective Tungsten", In: *Tungsten and Other Refractory Metals for VLSI Application III,* V.A. Wells, ed., Materials Res. Soc., Pittsburgh, PA, 69–72, (1988).

(List continued on next page.)

*Primary Examiner*—Son Mai
(74) *Attorney, Agent, or Firm*—Schwegman, Lundberg, Woessner & Kluth, P.A.

(57) ABSTRACT

A memory device is described which has an n-channel FET access transistor coupled between a memory cell and a data communication line. An NPN bipolar access transistor is also coupled between the memory cell and the data communication line in parallel to the n-channel access transistor. A base connection of the NPN bipolar access transistor is described as coupled to a body of the n-channel access transistor to control threshold voltage variations of the n-channel FET access transistor. During operation the n-channel FET access transistor is used for writing data to a memory cell, while the NPN bipolar access transistor is used for read operations in conjunction with a current sense amplifier circuit. The access transistors are described as fabricated as a single vertical pillar.

17 Claims, 7 Drawing Sheets

U.S. PATENT DOCUMENTS

| | | | |
|---|---|---|---|
| 4,051,354 | 9/1977 | Choate | 235/312 |
| 4,313,106 | 1/1982 | Hsu | 340/825.91 |
| 4,604,162 | 8/1986 | Sobczak | 156/657 |
| 4,617,649 | 10/1986 | Kyomasu et al. | 365/189 |
| 4,630,088 | 12/1986 | Ogura et al. | 357/23.6 |
| 4,663,831 | 5/1987 | Birrittella et al. | 29/576 E |
| 4,673,962 | 6/1987 | Chatterjee et al. | 357/23.6 |
| 4,677,589 | 6/1987 | Haskell et al. | 365/149 |
| 4,701,423 | 10/1987 | Szluk | 437/57 |
| 4,716,314 | 12/1987 | Mulder et al. | 307/477 |
| 4,761,768 | 8/1988 | Turner et al. | 365/201 |
| 4,766,569 | 8/1988 | Turner et al. | 365/185 |
| 4,845,537 | 7/1989 | Nishimura et al. | 357/23.4 |
| 4,888,735 | 12/1989 | Lee et al. | 365/185 |
| 4,920,065 | 4/1990 | Chin et al. | 437/52 |
| 4,920,515 | 4/1990 | Obata | 365/189.08 |
| 4,949,138 | 8/1990 | Nishimura | 357/23.6 |
| 4,958,318 | 9/1990 | Harari | 365/149 |
| 4,965,651 | 10/1990 | Wagner | 357/42 |
| 4,987,089 | 1/1991 | Roberts | 437/34 |
| 5,001,526 | 3/1991 | Gotou | 357/23.6 |
| 5,006,909 | 4/1991 | Kosa | 357/23.6 |
| 5,010,386 | 4/1991 | Groover, III | 357/42 |
| 5,017,504 | 5/1991 | Nishimura et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 357/49 |
| 5,072,269 | 12/1991 | Hieda | 357/23.6 |
| 5,083,047 | 1/1992 | Horie et al. | 307/465 |
| 5,087,581 | 2/1992 | Rodder | 437/41 |
| 5,102,817 | 4/1992 | Chatterjee et al. | 437/47 |
| 5,107,459 | 4/1992 | Chu et al. | 365/63 |
| 5,110,752 | 5/1992 | Lu | 437/47 |
| 5,128,831 | 7/1992 | Fox, III et al. | 361/396 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,221,867 | 6/1993 | Mitra et al. | 307/465 |
| 5,223,081 | 6/1993 | Doan | 156/628 |
| 5,266,514 | 11/1993 | Tuan et al. | 437/52 |
| 5,276,343 | 1/1994 | Kumagai et al. | 257/306 |
| 5,292,676 | 3/1994 | Manning | 437/46 |
| 5,308,782 | 5/1994 | Mazure et al. | 437/52 |
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,329,481 | 7/1994 | Seevinck et al. | 365/177 |
| 5,341,331 | 8/1994 | Jeon | 365/189.01 |
| 5,376,575 | 12/1994 | Kim et al. | 437/52 |
| 5,385,854 | 1/1995 | Batra et al. | 437/41 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,409,563 | 4/1995 | Cathey | 156/643 |
| 5,410,169 | 4/1995 | Yamamoto et al. | 257/301 |
| 5,414,287 | 5/1995 | Hong | 257/316 |
| 5,416,736 | 5/1995 | Kosa et al. | 365/174 |
| 5,422,296 | 6/1995 | Lage | 437/52 |
| 5,422,499 | 6/1995 | Manning | 257/67 |
| 5,427,972 | 6/1995 | Shimizu et al. | 437/52 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,451,889 | 9/1995 | Heim et al. | 326/81 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,502,629 | 3/1996 | Ito et al. | 363/60 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,576,238 | 11/1996 | Fu | 437/52 |
| 5,581,101 | 12/1996 | Ning et al. | 257/347 |
| 5,593,912 | 1/1997 | Rajeevakumar | 437/52 |
| 5,616,934 | 4/1997 | Dennison et al. | 257/67 |
| 5,627,097 | 5/1997 | Venkatesan et al. | 438/217 |
| 5,627,390 | 5/1997 | Maeda et al. | 257/302 |
| 5,637,898 | 6/1997 | Baliga | 257/330 |
| 5,640,342 | 6/1997 | Gonzalez | 365/156 |
| 5,641,545 | 6/1997 | Sandhu | 427/573 |
| 5,644,540 | 7/1997 | Manning | 365/200 |
| 5,646,900 | 7/1997 | Tsukude et al. | 365/205 |
| 5,674,769 | 10/1997 | Alsmeier et al. | 437/52 |
| 5,691,230 | 11/1997 | Forbes | 437/62 |
| 5,705,415 | 1/1998 | Orlowski et al. | 437/43 |
| 5,753,947 | 5/1998 | Gonzalez | 257/296 |
| 5,789,967 | 8/1998 | Katoh | 327/408 |
| 5,818,084 | 10/1998 | Williams et al. | 257/329 |
| 5,821,578 | 10/1998 | Shimoji | 257/295 |
| 5,821,796 | 10/1998 | Yaklin et al. | 327/313 |
| 5,827,765 | 10/1998 | Stengl et al. | 438/243 |
| 5,834,814 | 11/1998 | Ito | 257/378 |
| 5,852,375 | 12/1998 | Byrne et al. | 327/108 |
| 5,864,158 | 1/1999 | Liu et al. | 257/330 |
| 5,907,170 | 5/1999 | Forbes et al. | 257/296 |
| 5,909,400 | * 6/1999 | Bertin et al. | 365/177 |
| 5,909,618 | 6/1999 | Forbes et al. | 438/242 |
| 5,914,511 | 6/1999 | Noble et al. | 257/302 |
| 5,917,342 | 6/1999 | Okamura | 326/103 |
| 5,920,088 | 7/1999 | Augusto | 257/192 |
| 5,926,412 | * 7/1999 | Evans, Jr. et al. | 365/145 |
| 5,936,274 | 8/1999 | Forbes et al. | 257/315 |
| 5,963,469 | * 10/1999 | Forbes | 365/149 |
| 5,973,352 | 10/1999 | Noble | 257/315 |
| 5,973,356 | 10/1999 | Noble et al. | 257/319 |

OTHER PUBLICATIONS

Heavens, O., *Optical Properties of Thin Solid Films,* Dover Pubs., Inc., New York, 167, (1965).

Horie, H., et al., "Novel High Aspect Ratio Aluminum Plug for Logic/DRAM LSI's Using Polysilicon–Aluminum Substitute", Technical Digest: IEEE International Electron Devices Meeting, San Francisco, CA, 946–948, (1996).

Klaus, et al., "Atomic Layer Controlled Growth of SiO2 Films Using Binary Reaction Sequence Chemistry",*Applied Physics Lett. 70(9),* 1092–94, (Mar. 3, 1997).

Lehmann,, et al., "A Novel Capacitor Technology Based on Porous Silicon", *Thin Solid Films 276,* Elsevier Science, 138–42, (1996).

Masu, K., et al., "Multilevel Metallization Based on Al CVD", 1996 IEEE Symposium on VLSI Technology, Digest of Technical Papers, Honolulu, HI, 44–45, (Jun. 11–13, 1996).

McCredie, B.D., et al., "Modeling, Measurement, and Simulation of Simultaneous Switching Noise,", *IEEE Transactions on Components, Packaging, and Manufacturing Technology—Part B, 19,* 461–472, (Aug. 1996).

Muller, K., et al., "Trench Storage Node Technology for Gigabit DRAM Generations", Digest IEEE International Electron Devices Meeting, San Francisco, CA, 507–510, (Dec. 1996).

Ohba, T., et al., "Evaluation on Selective Deposition of CVD W Films by Measurement of Surface Temperature", In: *Tungsten and Other Refractory Metals for VLSI Applications II,* Materials Research Society, Pittsburgh, PA, 59–66, (1987).

Ohba, T., et al., "Selective Chemical Vapor Deposition of Tungsten Using Silane and Polysilane Reductions", In: *Tungsten and Other Refractory Metals for VLSI Applications IV,* Materials Research Society, Pittsburgh, PA, 17–25, (1989).

Ott, A.W., et al., "Al303 Thin Film Growth on Si(100) Using Binary Reaction Sequence Chemistry", *Thin Solid Films,* vol. 292, 135–44, (1997).

Ramo, S., et al., *Fields and Waves in Communication Electronics, Third Edition,* John Wiley & Sons, Inc., pp. 428–433, (1994).

Seevinck, E., et al., "Current–Mode Technique for High-Speed VLSI Circuits with Application to Current Sense Amplifier for CMOS SRAM's ", *IEEE Journal of Solid State Circuits,* 26(4), pp. 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques,* 42, 1765–1773, (Sep. 1994).

Stanisic, B.R., et al, "Addressing Noise Decoupling in Mixed–Signal IC's: Power Distribution Design and Cell Customization", *IEEE Journal of Solid–State Circuits,* 30, 321–326, (Mar. 1995).

Su, D.K., et al., "Experimental Results and Modeling Techniques for Substrate Noise in Mixed–Signal Integrated Circuits", *IEEE Journal of Solid–State Circuits,* 28(4), 420–430, (Apr. 1993).

Suntola, T., "Atomic Layer Epitaxy", *Handbook of Crystal Growth 3, Thin Films of Epitaxy, Part B: Growth Mechanics and Dynamics,* Elsevier, Amsterdam, 601–63, (1994).

Sze, S.M., *VLSI Technology, 2nd Edition,* Mc Graw–Hill, NY, 90, (1988).

Vittal, A., et al., "Clock Skew Optimization for Ground Bounce Control", 1996 IEEE/ACM International Conference on Computer–Aided Design, Digest of Technical Papers, San Jose, CA, 395–399, (Nov. 10–14, 1996).

Adler, E., et al., "The Evolution of IBM CMOS Dram Technology", y, 167–188, (Jan./Mar., 1995).

Asai, S., et al., "Technology Challenges for Integration Near and Below 0.1 micrometer", Proceedings of the IEEE, 85, Special Issue on Nanometer–Scale Science & Technology, 505–520, (Apr. 1997).

Askin, H.O., et al., "Fet Device Parameters Compensation Circuit", IBM Technical Disclosure Bulletin, 14, 2088–2089, (Dec. 1971).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits,* 27, 618–625, (Apr. 1992).

Bomchil, G., et al., "Porous Silicon: The Material and its Applications in Silicon–On–Insulator Technologies", *Applied Surface Science,* 41/42, 604–613, (1989).

Burnett, D., et al., "Implications on Fundamental Threshold Voltage Variations for High–Density SRAM and Logic Circuits", 1994 Symposium on VLSI Technology, Digest of Technical Papers, Honolulu, HI, 15–16, (Jun. 4–7, 1994).

Burnett, D., et al., "Statistical Threshold–Voltage Variation and its Impact on Supply–Voltage Scaling", Proceedings SPIE: Microelectronic Device and Multilevel Interconnection Technology, 2636, 83–90, (1995).

Chen, M.J., et al., "Optimizing the Match in Weakly Inverted MOSFET's by Gated Lateral Bipolar Action", *IEEE Transactions on Electron Devices,* 43, 766–773, (May 1996).

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).

Clemen, R., et al., "VT–compensated TTL–Compatible Mos Amplifier", IBM Technical Disclosure Bulletin, 21, 2874–2875, (1978).

De, V.K., et al., "Random MOSFET Parameter Fluctuation Limits to Gigascale Integration (GSI)", 1996 Symposium on VLSI Technology, Digest of Technical Papers, Honolulu, HI, 198–199, (Jun. 11–13, 1996).

DeBar, D.E., "Dynamic Substrate Bias to Achieve Radiation Hardening", *IBM Technical Disclosure Bulletin,* 25, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters,* 17, 509–511, (Nov. 1996).

Fong, Y., et al., "Oxides Grown on Textured Single–Crystal Silicon—Dependence on Process and Application in EEPROMs", *IEEE Transactions on Electron Devices,* 37, 583–590, (Mar. 1990).

Forbes, L., "Automatic On–clip Threshold Voltage Compensation", IBM Technical Disclosure Bulletin, 14, 2894–2895, (1972).

Frantz, H., et al, "Mosfet Substrate Bias–Voltage Generator", IBM Technical Disclosure Bulletin, 11, 1219–1220, (Mar. 1969).

Fuse, T., et al., "A 0.5V 200MHz 1–State 32b ALU Using a Body Bias Controlled SOI Pass–Gate Logic", 1997 IEEE International Solid–State Circuits Conference, Digest of Technical Papers, 286–287, (1997).

Gong, S., et al., "Techniques for Reducing Switching Noise in High Speed Digital Systems", Proceedings of the 8th Annual IEEE International ASIC Conference and Exhibit, 21–24, (1995).

Hao, M.Y., et al., "Electrical Characteristics of Oxynitrides Grown on Textured Single–Crystal Silicon", *Appl. Phys. Lett.,* 60, 445–447, (Jan. 1992).

Harada, M., et al., "Suppression of Threshold Voltage Variation in MTCMOS/SIMOX Circuit Operating Below 0.5 V", 1996 Symposium on VLSI Technology, Digest of Technical papers, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", 1991 IEEE International Electron Devices Meeting, Technical Digest, Washington, D.C., 959–961, (Dec. 8–11, 1991).

Hodges, D.A., et al., "MOS Decoders", In: *Analysis and Design of Digital Integrated Circuits, 2nd Edition,* McGraw Hill Book Co., New York, 354–357, (1988).

Holman, W.T., et al., "A Compact Low Noise Operational Amplifier for 1.2 Micrometer Digital CMOS Technology", *IEEE Journal of Solid–State Circuits,* 30, 710–714, (Jun. 1995).

Hu, G., et al., "Will Flash Memory Replace Hard Disk Drive?", 1994 IEEE International Electron Device Meeting, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices,* 42, 506–512, (Mar. 1995).

Jun, Y.K., et al., "The Fabrication and Electrical Properties of Modulated Stacked Capacitor for Advanced DRAM Applications", *IEEE Electron Device Letters,* 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits,* 31, 1575–1582, (Nov. 1996).

Kang, H.K., et al., "Highly Manufacturable Process Technology for Reliable 256 Mbit and 1Gbit DRAMs", IEEE International Electron Devices Meeting, Technical Digest, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995,* R.C. Ellwanger, et al., (eds.), Materials Research Society, Pittsburgh, PA, 675–680, (1996).

Kishomoto, T., et al., "Well Structure by High–Energy Boron Implantation for Soft–Error Reduction in Dynamic Random Access Memories (DRAMs)", *Japanese Journal of Applied Physics,* 34, 6899–6902, (Dec. 1995).

Kohyama, Y., et al., "Buried Bit–Line Cell for 64MB DRAMS", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics,* 30, L1221–L1223, (Jul. 1991).

Kuge, S., et al., "SOI–DRAM Circuit Technologies for Low Power High Speed Multigiga Scale Memories", *IEEE Journal of Solid–State Circuits,* 31, 586–591, (Apr. 1996).

Lantz, II, L., "Soft Errors Induced By Alpha Particles", *IEEE Transactions on Reliability,* 45, 174–179, (Jun. 1996).

Lehmann, V., "The Physics of Macropore Formation in Low Dopes n–Type Silicon", *Journal of the Electrochemical Society,* 140(10), 2836–2843, (Oct. 1993).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Phi–Shape Transistor (VPhiT) Cell for 1 Gbit DRAM and Beyond", 1994 Symposium of VLSI Technology, Digest of Technical Papers, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices,* 42, 2117–2123, (Dec. 1995).

Malaviya, S., *IBM TBD,* 15, p. 42, (Jul. 1972).

Nitayama, A., et al., "High Speed and Compact CMOS Circuits with Multipillar Surrounding Gate Transistors", *IEEE Transactions on Electron Devices,* 36, 2605–2606, (Nov. 1989).

Ohba, T., et al, "Selective Chemical Vapor Deposition of Tungsten Using Silane and Polysilane Reductions", In: *Tungsten and Other Refractory Metals for VLSI Applications IV,* Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes,* 6, 302–305, (Sep. 1995).

Oowaki, Y., et al., "New alpha–Particle Induced Soft Error Mechanism in a Three Dimensional Capacitor Cell", *IEICE Transactions on Electronics,* 78–C, 845–851, (Jul. 1995).

Oshida, S., et al, "Minority Carrier Collection in 256 M–bit DRAM Cell on Incidence of Alpha–Particle Analyzed by Three–Dimensional Device Simulation", *IEICE Transactions on Electronics,* 76–C, 1604–1610, (Nov. 1993).

Ott, A.W., et al., "A1303 Thin Film Growth on SI(100) Using Binary Reaction Sequence Chemistry", *Thin Solid Films,* vol. 292, 135–44, (1997).

Ozaki, T., et al., "A Surrounding Isolation–Merged Plate Electrode (SIMPLE) Cell with Checkered Layout for 256Mbit DRAMs and Beyond", 1991 IEEE International Electron Devices Meeting, Washington, D.C., 469–472, (Dec. 8–11, 1991).

Parke, S.A., et al, "A High–Performance Lateral Bipolar Transistor Fabricated on SIMOX", *IEEE Electron Device Letters,* 14, 33–35, (Jan. 1993).

Pein, H., et al., "A 3–D Sidewall Flash EPROM Cell and Memory Array", *IEEE Transactions on Electron Devices,* 40, 2126–2127, (Nov. 1993).

Pein, H., et al., "Performance of the 3–D PENCIL Flash EPROM Cell and Memory Array", *IEEE Transactions on Electron Devices,* 42, 1982–1991, (Nov., 1995).

Pein, H.B., et al., "Performance of the 3–D Sidewall Flash EPROM Cell", IEEE International Electron Devices Meeting, Technical Digest, 11–14, (1993).

Puri, Y., "Substrate Voltage Bounce in NMOS Self–biased Substrates", *IEEE Journal of Solid–State Circuits,* SC–13, 515–519, (Aug. 1978).

Ramo, S., et al., "Fields and Waves in Communication Electronics", *IEEE Journal of Solid–State Circuits,* SC–13, 515–519, (Aug. 1978).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", IEEE International Electron Devices Meeting, Washington, D.C., 714–717, (Dec. 1–4, 1985).

Sagara, K., et al., "A 0.72 micro–meter2 Recessed STC (RSTC) Technology for 256 Mbit DRAMs using Quarter–Micron Phase–Shift Lithography", 1992 Symposium on VLSI Technology, Digest of Technical Papers, Seattle, WA, 10–11, (Jun. 2–4, 1992).

Saito, M., et al., "Technique for Controlling Effective Vth in Multi–Gbit DRAM Sense Amplifier", 1996 Symposium on VLSI Circuits, Digest of Technical Papers, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of SolidState Circuits,* 26, 525–536, (Apr. 1991).

Shah, A.H., et al., "A 4–Mbit DRAM with Trench–Transistor Cell", *IEEE Journal of Solid–State Circuits,* SC–21, 618–625, (Oct. 1986).

Shah, A.H., et al., "A 4Mb DRAM with Cross–Point Trench Transistor Cell", 1996 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stanisic, D.K., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su; D.K., et al., "Experimental Results and Modeling Techniques for Substrate Noise in Mixed Signal Integrated Circuits", *IEEE Journal of Solid–State Circuits*, 20(4), 420–430, (Apr. 1993).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sunouchi, K., et al, "A Surrounding Gate Transistor (SGT) Cell for 64/256Mbit DRAMs", 1989 IEEE International Electron Devices Meeting, Technical Digest, Washington, D.C., 23–26, (Dec. 3–6, 1989).

Sunouchi, K., et al., "Process Integration for 64M DRAM Using an Asymmetrical Stacked Trench Capacitor (AST) Cell", 1990 IEEE International Electron Devices Meeting, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research, B–99*, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", IEEE International Electron Devices Meeting, Technical Digest, 222–225, (1988).

Takato, H., et al.,"Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64 Mbit and 256 Mbit DRAMs", 1991 Symposium on VLSI Technology, Digest of Technical Papers, Oiso, 13–14, (May 28–30, 1991).

Terauchi, M., et al., "A Surrounding Gate Transistor (SGT) Gain Cell for Ultra High Density DRAMs", 1993 Symposium on VLSI Technology, Digest of Technicap Papers, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices 38*, 2487–2496, (Nov. 1991).

Wang, N., *Digital MOS Integrated Circuits*, Prentice Hall, Inc. , Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256 Mb DRAMs", IEEE International Electron Devices Meeting, Technical Digest, San Francisco, CA, 259–262, (Dec. 13–16, 1992).

Watanabe, H., et al., "A Novel Stacked Capacitor with Porous–Si Electrodes for High Density DRAMs", 1993 Symposium on VLSI Technology, Digest of Technical Papers, Kyoto, Japan, 17–18, (1993).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokahama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Wooley, et al., "Experimental Results and Modeling Techniques for Substrate Noise in Mixed Signal Integrated Circuits", *IEEE Journal of Solid State Circuits*, vol. SC–28, 420–30, (1993).

Yamada, T., et al., "A New Cell Structure with a Spread Source/Drain (SSD) MOSFET and A Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", 1996 Symposium on VLSI Technology, Digest of Technical Papers, Honolulu, HI, 240–241, (Jun. 11–13, 1996).

* cited by examiner

VERTICAL BIPOLAR READ ACCESS FOR LOW VOLTAGE MEMORY CELL

"This application is a continuation of U.S. Ser. No. 09/028,249, filed Feb. 24, 1998 now U.S. Pat. No. 5,963, 469."

TECHNICAL FIELD OF THE INVENTION

The present invention relates generally to integrated circuits and in particular the present invention relates to integrated circuit memory devices.

BACKGROUND OF THE INVENTION

Complimentary metal oxide semiconductor field effect transistors (CMOS FETs) are prevalent in integrated circuit technology because they generally demand less power than bipolar transistors. Threshold voltage variations of CMOS transistors, however, are beginning to pose impractical limitations on CMOS devices as power supply voltages are reduced. In a 0.2 micron CMOS technology a 0.4 V distribution in threshold voltages might be anticipated. With a one volt power supply, this distribution can cause large variations in the speed of a logic circuit, such as those used in integrated memory circuits. For example, a threshold voltage of 0.6 V is required in a DRAM memory cell access transistor to insure low sub-threshold voltage leakage currents. If a threshold voltage distribution of 0.4 volts is experienced, there will be instances where little or no excess voltage above threshold voltage is available. As such, data transfer from a memory cell via such a transistor will be very slow.

A basic problem with CMOS access transistors results from the fact that CMOS devices do not function well at low voltages and require the use of higher than desirable power supply voltages, currently around two volts in 0.2 micron CMOS technology. Various techniques have been proposed to compensate for this in CMOS technology. For example, some form of transistor forward body bias, or specialized circuits to compensate for threshold voltage variations can be used.

Various types of lateral MOS transistors have been described and utilized in CMOS technology. Lateral bipolar transistors have received renewed interest with the advent of bipolar complementary metal oxide semiconductor (BiCMOS) technologies.

For the reasons stated above, and for other reasons stated below which will become apparent to those skilled in the art upon reading and understanding the present specification, there is a need in the art for an access device for use in a low voltage memory device which performs fast read access of memory data.

SUMMARY OF THE INVENTION

The above mentioned problems with integrated circuit memory devices and other problems are addressed by the present invention and which will be understood by reading and studying the following specification. A memory cell access device is described which uses a combination of Bipolar and CMOS transistors.

In particular, the present invention describes a memory cell access device comprising an n-channel FET access transistor coupled between a memory cell and a data communication line, and an NPN bipolar access transistor coupled between the memory cell and the data communication line. The n-channel access transistor and the NPN bipolar access transistor are connected in parallel, and a base connection of the NPN bipolar access transistor is coupled to a body of the n-channel access transistor.

In another embodiment, a low voltage memory cell access device fabricated as a vertical pillar structure. The memory cell access device comprises an FET access transistor coupled between a memory cell and a data communication line, and a bipolar transistor coupled between the memory cell and the data communication line. The FET access transistor and the bipolar transistor are connected in parallel, with a base connection of the bipolar transistor is coupled to a body of the FET access transistor.

A memory device having a low voltage supply is also described. The memory device comprises a plurality of memory cells, a plurality of data communication bit lines, and a plurality of memory cell access devices coupled between the plurality of memory cells and the plurality of data communication bit lines. Each of the plurality of memory cell access devices comprises an FET access transistor, and a bipolar access transistor. The FET access transistor and the bipolar access transistor are connected in parallel between a memory cell and a data communication bit line.

In another embodiment, a method of accessing a memory cell is described. The method comprises the steps of activating an FET access transistor coupled between the memory cell and a data communication line for writing data charge to the memory cell, and activating a bipolar access transistor coupled between the memory cell and a data communication line for reading a charge stored on the memory cell.

DETAILED DESCRIPTION OF THE INVENTION

Figure 1:
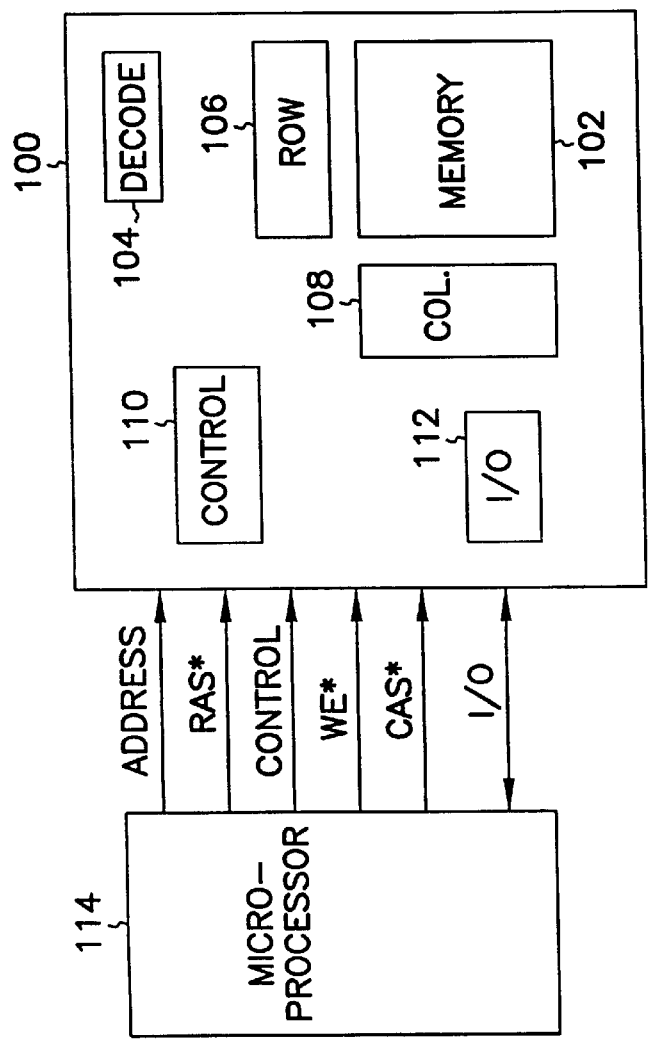
FIG. 1 is a simplified block diagram of a memory device of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Smaller integrated circuit devices combined with the development of vertical integrated circuit structures, make it possible to utilize bipolar transistor action rather than just MOSFET operation. In fact, a bipolar transistor structure can be used as a data read access device and a MOSFET transistor used as a data write access device, as described herein. To appreciate the present invention, a brief description of a basic DRAM device is provided followed by a detailed description of access devices of the present invention.

DRAM DEVICE

FIG. 1 is a simplified block diagram of a memory device incorporating the access device of the present invention. The memory device 100 includes an array of memory cells 102, address decoder 104, row access circuitry 106, column access circuitry 108, control circuitry 110, and Input/Output circuit 112. The memory can be coupled to an external microprocessor 114, or memory controller for memory accessing. The memory receives control signals from the processor 114, such as WE*, RAS* and CAS* signals. The memory is used to store data which is accessed via I/O lines. It will be appreciated by those skilled in the art that additional circuitry and control signals can be provided, and that the memory device of FIG. 1 has been simplified to help focus on the present invention.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Figure 2:
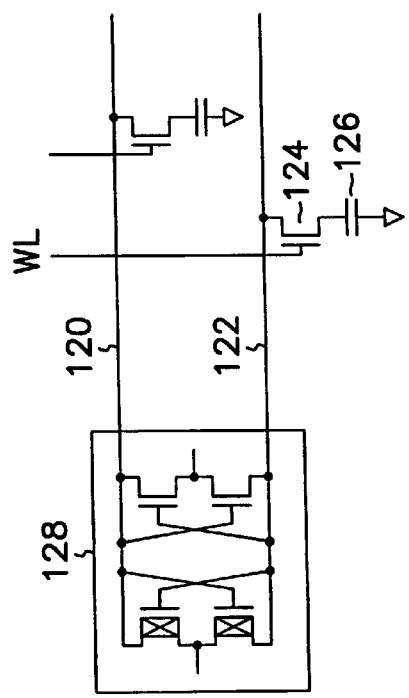
FIG. 2 is a portion of a prior art memory device.

Referring to FIG. 2, a portion of a prior art memory device is described. The simplified schematic diagram illustrates a column of the memory array 102. The column is generally defined by a pair of digit lines 120 and 122. N-channel CMOS access transistors 124 are located along the digit lines for coupling memory cells 126 to a digit line. The access transistors are activated by a word line (WL), which defines a row of the memory array. A differential voltage amplifier circuit 128 is provided to detect and amplify voltage signals provided on the digit lines. As described above, a large variation in a threshold voltage of the access transistors can result in slow data access. This slow access is most troubling in data read operations. The present invention avoids this access speed problem while maintaining a higher Vt. That is, for access transistors 124 in a DRAM memory circuit a larger Vt value is desired to reduce memory cell leakage and increase retention time in the memory cells.

Bipolar/CMOS Memory Cell Access Device

Figure 3A:
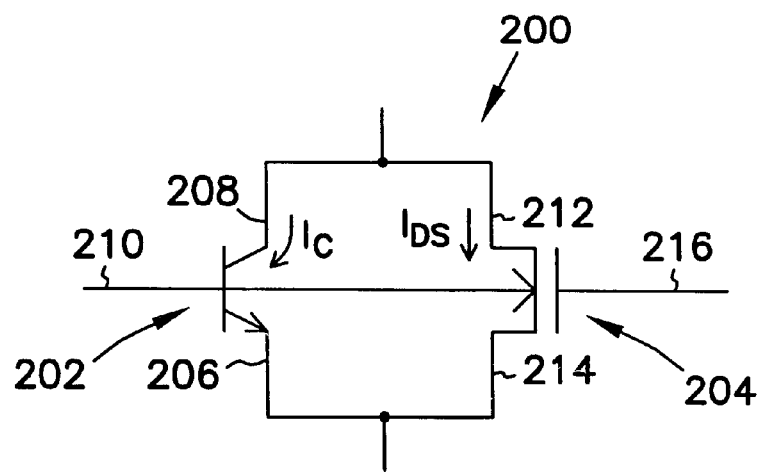
FIG. 3A illustrates a schematic diagram of a vertical access device.

FIG. 3A illustrates a schematic diagram of a vertical access device 200 having both a bipolar access device 202 and a vertical MOSFET access transistor 204 which can be formed in either bulk or SOI technology. The bipolar access device 202 is an NPN transistor having an emitter 206, collector 208 and a base 210. The MOSFET access transistor 204 is an n-channel transistor having a drain 212, source 214 and a gate 216. The access device can be fabricated as a single unit, or as separate transistors.

Figure 3B:
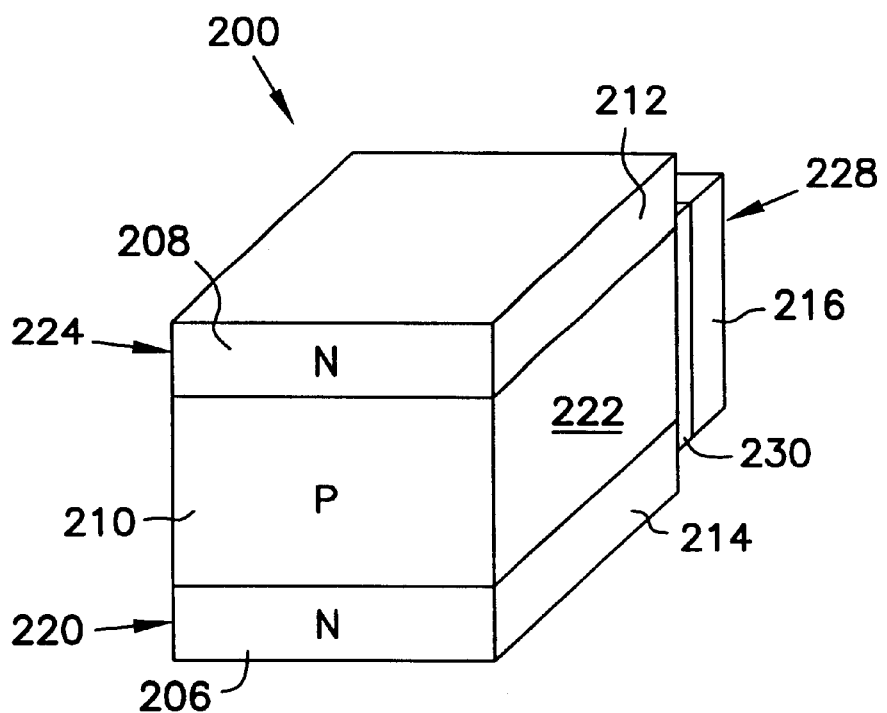
FIG. 3B illustrates a one fabricated integrated circuit embodiment of the access device of FIG. 3A.
Figure 3C:
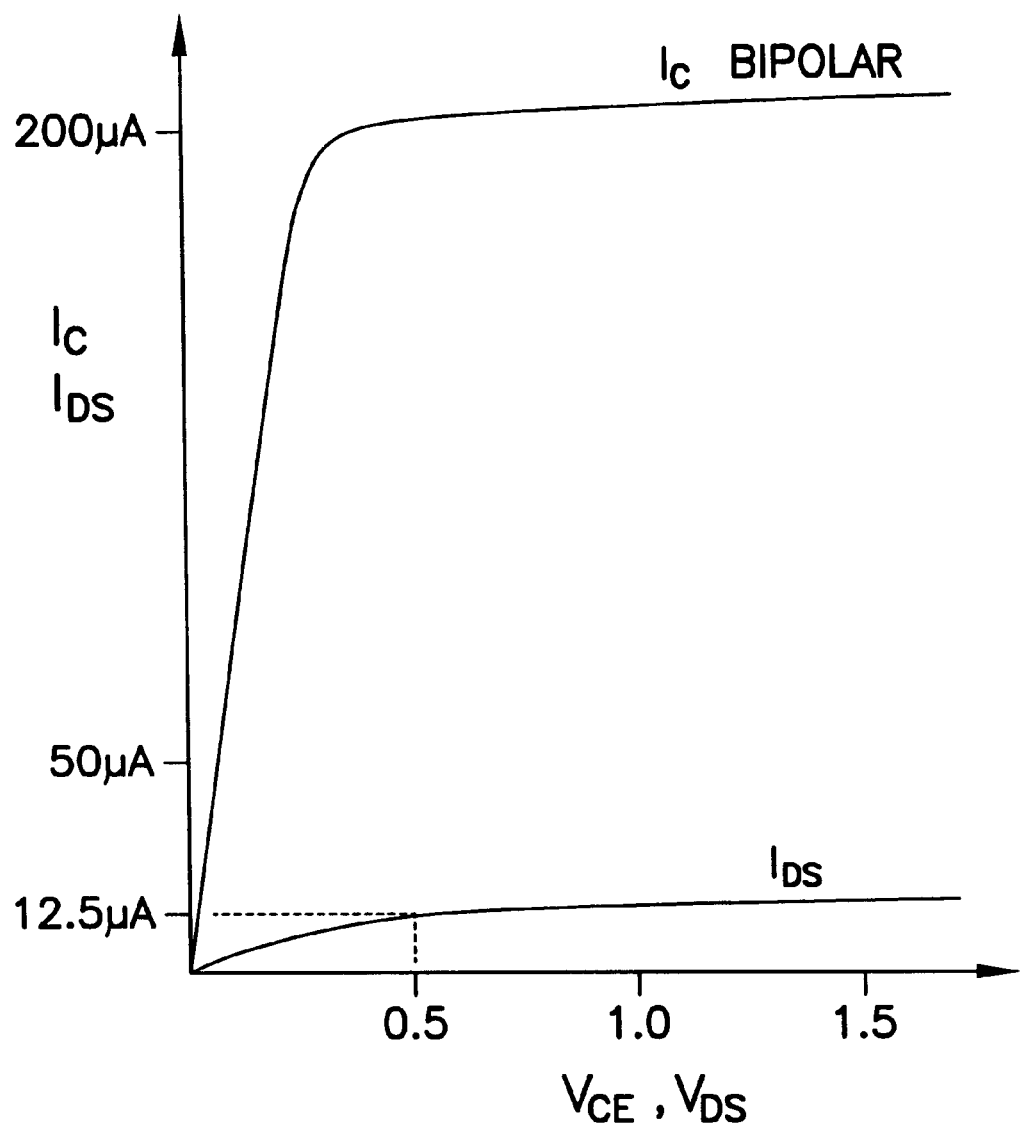
FIG. 3C is a graph of the operating currents of the access device of FIG. 3A.

One fabricated integrated circuit embodiment of the access device 200 is generally illustrated in the prospective view of FIG. 3B. The device is a single unit having a shared pillar construction. The access device comprises a common N+ doped semiconductor layer 220 which acts as both emitter 206 and source 214. A common p-type region 222 is provided as base 210 and a body of transistor 204. The access device also has a common N+ doped semiconductor layer 224 which acts as both collector 208 and drain 212. A semiconductor region 228 is provided adjacent to layer 222 to form gate 216. Gate region 216 is isolated from layer 222 by gate insulator 230. Drain current $I_D$ and collector current $I_C$ for separate transistors fabricated in a 0.2 micron device are provided in FIG. 3C. At a given voltage ($V_{CE}$ or $V_{DS}$) such as 0.5 volts, the collector current of a bipolar transistor is approximately 200 micro-amps while a drain current is only 12.5 micro-amps. Thus, it would be advantageous to use a bipolar transistor to read data in a shorter time period by exploiting the higher current.

Figure 4A:
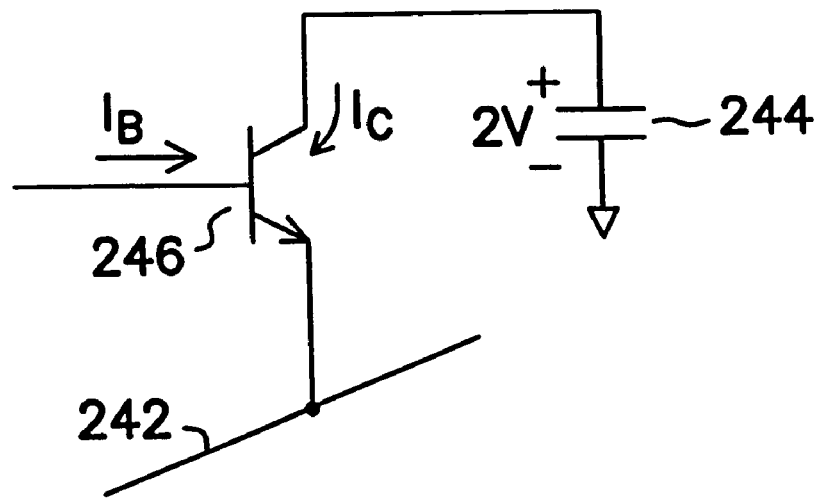
FIG. 4A depicts the application of a bipolar read access transistor.
Figure 4B:
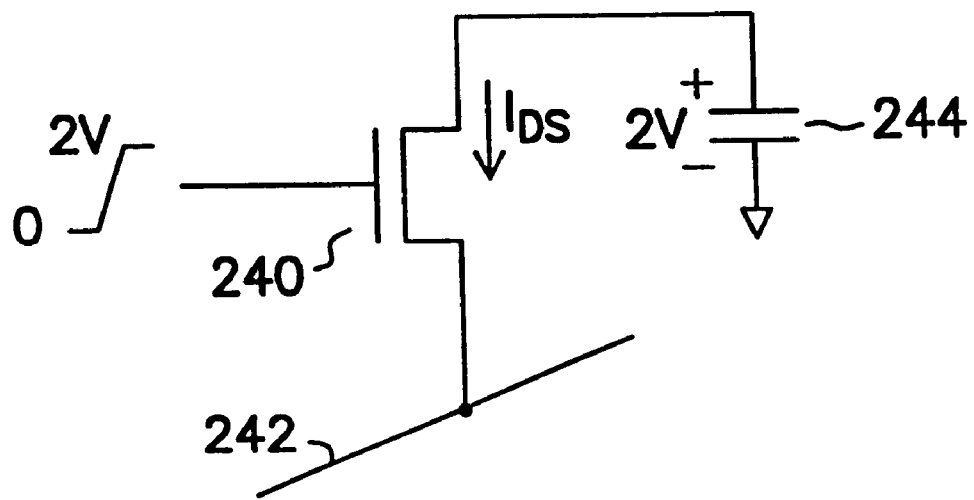
FIG. 4B depicts the application of a MOSFET read access transistor.

To further illustrate the advantage of using a bipolar transistor for data read operations in a low voltage memory, FIGS. 4A and 4B depict the application of a bipolar read access transistor 246 and a MOSFET read access transistor 240, respectively. With a MOSFET n-channel access transistor 240 it is customary to precharge a data communication bit line 242 to ½ $V_{DD}$ or in this illustration one volt. The peak transfer current $I_D$ is estimated to be around 12.5 uA assuming a Vt of 0.5 volts. That is, the drain current is calculated by:

$$I_D = \mu Co\left(\frac{W}{L}\right)\left(\frac{(Vgs - Vt)^2}{2}\right) \text{ where } W = L$$

$$I_D = 100 * 1 * \left(\frac{1}{2}\right)^3 = 12.5 \text{ μA}$$

If the memory cell is assumed to store 40 fC, the charge from the memory cell requires 3 nano-seconds to transfer to the bit line through transistor 240.

A faster data transfer is possible if bipolar access transistor 246 is used with a clamped bit line where the bit line is precharged to a lower voltage, such as ½ V. The peak bipolar current is determined mostly by the base current $I_B$ and the variation of current gain, β, with peak current Assuming a base current of 2.0 uA, a peak collector value of 200 uA is estimated by:

$$I_C = \beta I_B \text{ where } \beta = 100$$

If the memory cell is assumed to store the same 40 fC, the charge from the memory cell requires only 0.2 nano-seconds to transfer to the bit line. A substantial decrease in transfer time, therefore, is experienced by using a bipolar access transistor during read operations in the low voltage memory.

Vertical Access Devices

Figure 5A:
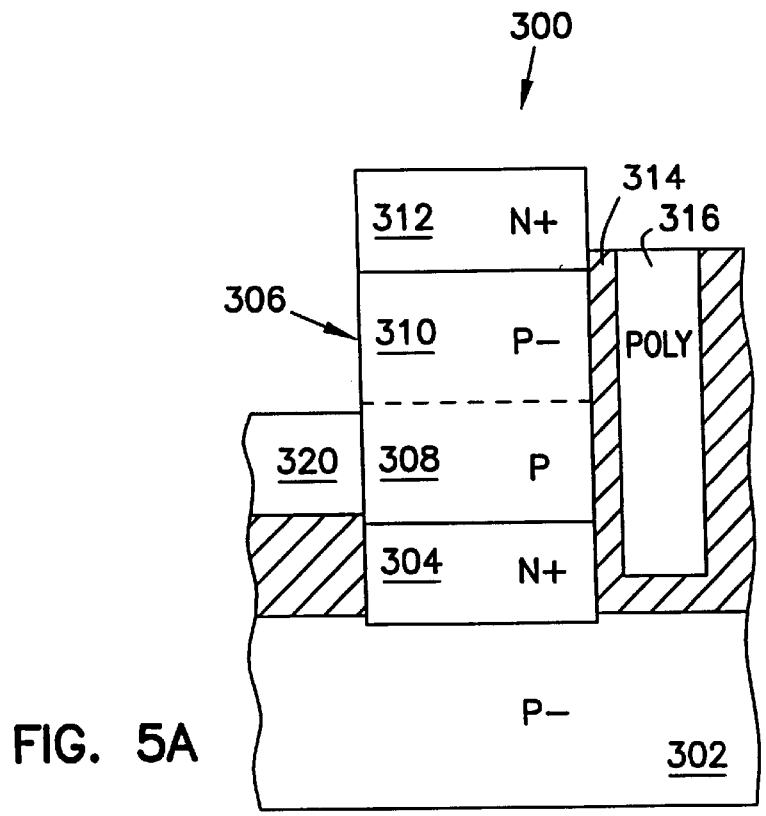
FIG. 5A is a cross section of an access device formed in bulk silicon.
Figure 5B:
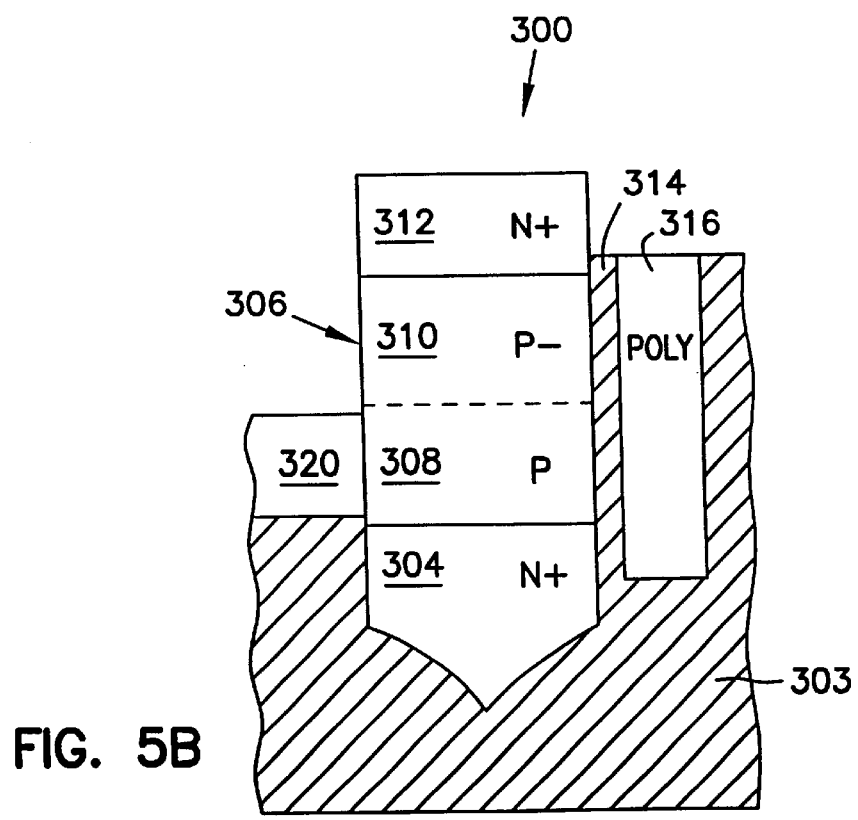
FIG. 5B is a cross section of an access device formed in silicon-on-insulator (SO) device.

Two example embodiments of an access device 300 of the present invention which can be formed in either bulk or silicon-on-insulator (SOI) technology are illustrated in cross-section in FIGS. 5A and 5B, respectively. The access device as fabricated with conventional bulk silicon technology (Figure SA) includes an N+ semiconductor bit line 304 formed on a P-type substrate 302, or base layer. A P-doped semiconductor region 306 is fabricated on bit line 304. The vertical doping profile of region 306 is varied, as explained below, to optimize bipolar transistor action. An N+semiconductor layer 312 is provided on top of layer 306. Polysilicon region 316 is fabricated to operate as a CMOS gate isolated from layer 306 by gate oxide layer 314. A polysilicon base contact 320 is provided opposite gate 316 and in contact with region 306.

The access device as fabricated with conventional SOI technology (FIG. 5B) includes an N+ semiconductor bit line 322 formed on oxide 303, or insulating base layer. The remaining components of the access device are substantially the same as the access device of Figure 5A, although fabrication techniques may differ. A contact is made to layer 312, using techniques known in the art, to a memory cell such as a stacked capacitor cell.

A vertical doping profile of region 306 of the access device is optimized for both bipolar transistor action and biasing the body of the CMOS transistor to a value around 0.9 V to forward bias the base emitter junction. The doping profile is controlled so that the bottom portion 308 of layer 306 is more heavily doped p-type than a top region 310. This difference in doping is represented by the designations P and P−. The actual doping levels with respect to other structures or base layers can be varied, and relative doping levels between the top and bottom regions of layer 306 is only represented herein.

One way to create the difference in the doping profile is to use the effects of the fabrication of collector 312. When the collector, or top n-type layer 312, is fabricated a relatively higher base doping level near emitter 304 or 322 can be created. This doping profile is required in a vertical NPN transistor to give field-aided diffusion in the base and a high current gain, β. If the base doping is around $2 \times 10^{18}/cm^3$, as is common in NPN transistors, then region 308 also serves to make the n-channel vertical MOSFET enhancement mode, which is difficult to achieve by other techniques since implantations for threshold voltage adjustment cannot be conveniently done.

Threshold Voltage, for CMOS Transistor

One estimated threshold voltage range for the n-channel transistor formed along a sidewall of the access device 300 is described as follows. It is assumed that transistor gate 316 is separated from body layer 306 by a gate oxide 314 having a thickness of 40 Å. It is also assumed that a base doping at the center of pillar region 306 is around $2.5 \times 10^8/cm^3$. Some boron depletion at the surface will be experienced, thus a doping of $1 \times 10^{18}$ is used in the calculation of the threshold voltage.

$$V_T = 2\Phi_f - \Phi_{ms} + \frac{Q_B}{C_{OX}} - \frac{Q_{OX}}{C_{OX}} - \Delta V_T$$

$$C_{OX} = 8 \times 10^{-7}, Q_B = 4 \times 10^{-7}, \frac{Q_B}{C_{OX}} \text{ also } = \gamma \sqrt{2\Phi_f + V_{BG}}$$

where $\Delta V_T$ is a result of DIBL+2D effects $$\therefore V_T \approx 0.7 - 0.9 + 0.5 - 0.1 - 0.2 = 0$$

$$V_T \approx 0.7 - 0.9 + 0.5 - 0.1 - 0.0 = 0.2$$

The change in Vt (ΔVt) is calculated to be 0.2 volts as a result of drain-induced barrier lowering (DIBL) and 2D effects. Further, a body bias coefficient of threshold voltage, γ, is estimated to be 0.6 $V/V^{1/2}$. A threshold voltage of approximately 0.0 to 0.2 V, therefore, is estimated when the MOSFET has no body bias voltage ($V_{BG}$).

Access Operations

Figure 6A:
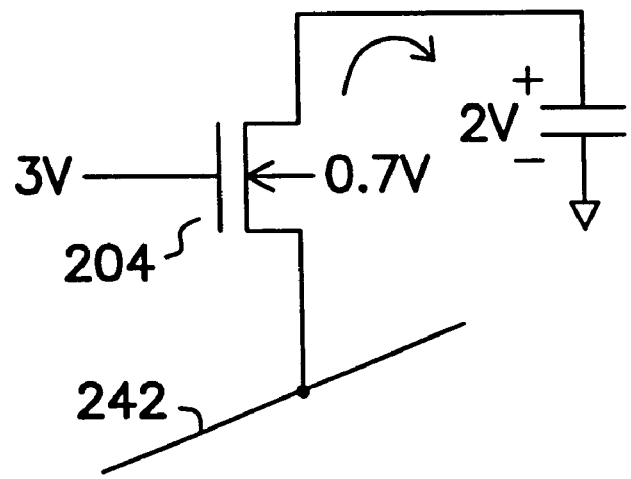
FIG. 6A is depicts the application of a bipolar read access transistor in a DRAM.
Figure 6B:
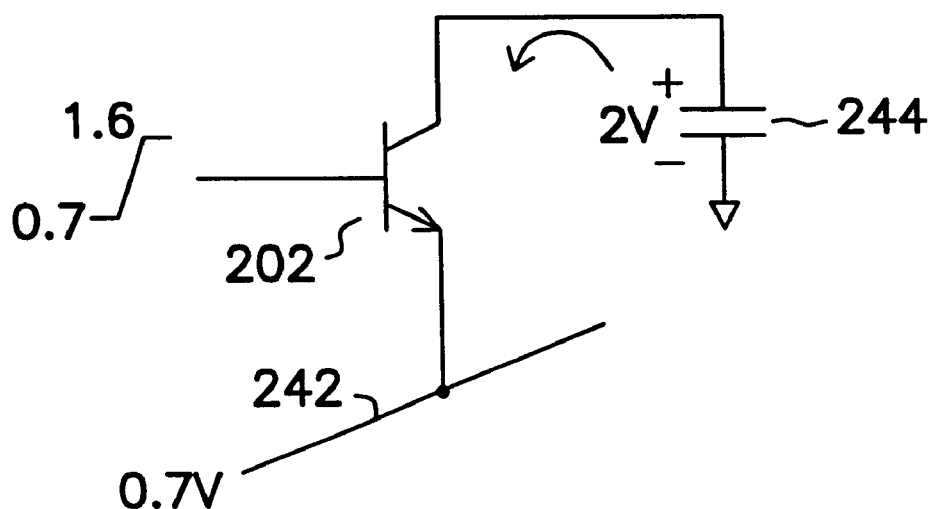
FIG. 6B is depicts the application of a MOSFET write access transistor in a DRAM.

Referring to FIGS. 6A and 6B, the voltages applied to the access device 200 and bit line voltages are provided to understand the present invention in a DRAM application. During a write operation the base of BJT transistor 202 is coupled to a low voltage, such as 0.7 volts. The body potential in layer 306, therefore, is held at the low level resulting in a MOSFET body bias which increases as the memory is charged due to an elevated bit line potential. As a result, the threshold voltage of transistor 204 rises to around one volt. A bootstrapped voltage as known to those skilled in the art can be used to drive the gate voltage above two volts, such as three volts. This booted voltage is necessary because the supply voltage is limited to two volts, and a second supply is typically not provided. The time required for the write operation is not critical and can be much longer than the read response. Thus, the reduced power requirements of the MOSFET are desirable.

As shown in FIG. 6B, during a read operation the bit lines are clamped to a low voltage (near the base low voltage), in this example 0.7 V. The voltage of the word lines does not change significantly during a read operation, unlike in a memory using a conventional voltage sense amplifier, since here current not voltage is being sensed. During a read operation, the read word line goes to a higher voltage, such as 1.6 V, to forward bias the base-emitter junction and turn on the bipolar transistor 202. The bipolar transistor will be strongly forward biased and quickly discharge the charge stored on the memory storage capacitor onto the bit line where it can be sensed as a current. The memory cell discharges to about 0.9 V at which point the bipolar transistor saturates and stops functioning. The memory cell data state voltage levels are therefore two volts when charged, and 0.9 V when discharged.

Figure 7A:
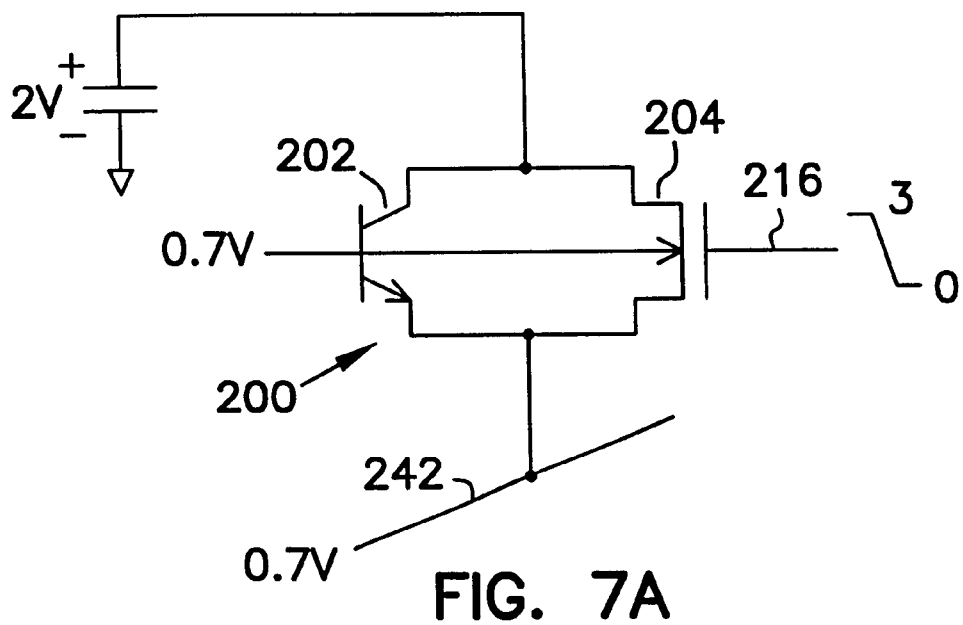
FIG. 7A illustrates an access device with a one data state stored on a memory cell.

Current leakage is always a concern in DRAM cells since it limits data retention time. FIG. 7A illustrates the access device 200 when a one data state (2 V) is stored on a memory cell. Both transistors are off under all possible conditions and there are no extraneous leakage currents nor leakage current paths. The voltage levels on transistor gate 216 are zero, or ground, and a bootstrapped value of 3 V. The standby voltage level on the base of transistor 202 is 0.7 V. Thus, if the bit line is clamped at 0.7 V during standby, there is no forward bias on the bipolar transistor 202 and the body and source of the MOSFET are both held at 0.7 V. The standby level on gate 216 is ground so that a gate-to-source voltage on the MOSFET is negative (−0.7 V). Neither transistor conducts leakage current when a charge is stored on the capacitor in a standby or idle condition.

Figure 7B:
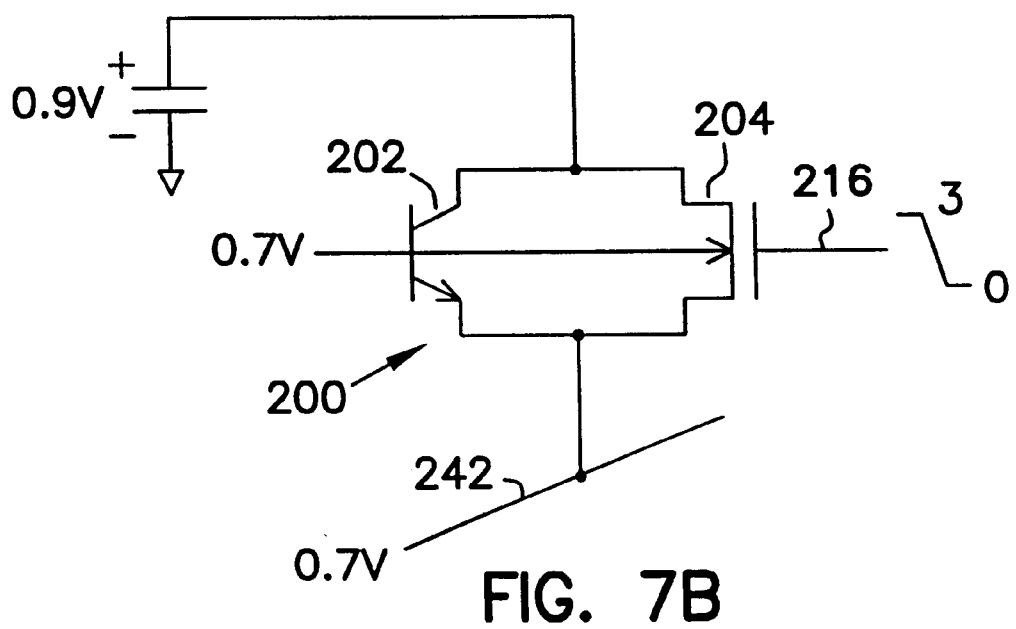
FIG. 7B illustrates an access devicewith a zero data state is stored on the memory cell.

FIG. 7B illustrates the access device 200 when a zero data state is stored on the memory cell. As stated above, a logical zero is stored on the cell as 0.9 V. This is the lowest value to which the bipolar transistor can discharge the memory cell capacitor when the bit line is clamped at 0.7 V. Both transistors are off, and there is no tendency for either transistor to charge or discharge the storage capacitor in this standby condition.

It is estimated that a bit line current sense amplifier is about eight times faster than the a bit line differential voltage sense amplifier commonly used in DRAMs. Further, as detailed above, current transfer from a memory cell to a bit line using the bipolar transfer device is about eight times faster than an n-channel MOSFET transfer device. The net result is that the present invention, when used in a low voltage memory device for data read operations, is about eight times faster than commonly used CMOS DRAMs. Further, a vertical access transistor device with a buried word address line and a buried bit line on bulk or SOI technology in combination with a stacked capacitor is only $4F^2$ in area. A DRAM according to the present invention, therefore, is about one-half the area of conventional DRAM's and about eight times faster.

In operation, the bipolar device would be used for reads and the MOSFET device on the other side of the device pillar can most conveniently be used for write operations to store information on the memory capacitor in a conventional manner. The present invention can be scaled to lower power supply voltages and smaller dimensions, in which case the use of the bipolar access device becomes yet more advantageous. For one volt power supply voltages, the threshold voltage variations of MOSFETs will become a large fraction of the total voltage available.

Conclusion

A memory device has been described which has an n-channel FET access transistor coupled between a memory cell and a data communication line. An NPN bipolar access transistor is also coupled between the memory cell and the data communication line in parallel to the n-channel access transistor. A base connection of the NPN bipolar access transistor has been described as coupled to a body of the n-channel access transistor to control threshold voltage variations of the n-channel FET access transistor. During operation the n-channel FET access transistor is used for writing data to a memory cell, while the NPN bipolar access transistor is used for read operations in conjunction with a current sense amplifier circuit. The access transistors are described as fabricated as a single vertical pillar.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A processing system comprising:
    a processor; and
    a memory device coupled to the processor, the memory device receives control signals from the microprocessor and comprises:
        an n-channel FET access transistor coupled between a memory cell and a data communication line, and
        an NPN bipolar access transistor coupled between the memory cell and the data communication line, such that the n-channel access transistor and the NPN bipolar access transistor are connected in parallel, a base connection of the NPN bipolar transistor is coupled to a body of the n-channel access transistor, wherein the FET access transistor writes the information from the external microprocessor, and wherein the NPN bipolar access transistor reads the information from the external microprocessor in conjunction with a current sense amplifier.

2. The processor system of claim 1 wherein the n-channel transistor and the NPN bipolar access transistor are fabricated as a single unit.

3. The processor system of claim 1 wherein the memory device is fabricated in a low voltage memory device receiving a supply voltage which is less than three volts.

4. The processor system of claim 1 wherein the memory device is a dynamic random access memory (DRAM).

5. A single transistor unit having an n-channel field effect transistor (FET) and an NPN bipolar transistor, the single transistor unit comprising:
    a first n-type semiconductor layer which forms both an emitter of the n-channel FET and a collector of the NPN bipolar transistor,
    a p-type semiconductor layer located above the first n-type semiconductor layer which forms a body of the n-channel FET and a base of the NPN bipolar transistor;
    a second n-type semiconductor layer located above the p-type semiconductor layer which forms a drain of the n-channel FET and a collector of the NPN bipolar transistor;
    a semiconductor region located laterally adjacent to the p-type semiconductor layer, the semiconductor region is laterally spaced from the p-type semiconductor layer by an insulator such that the semiconductor region forms a gate of the n-channel FET.

6. The single transistor unit of claim 5 wherein the p-type semiconductor layer has a vertical doping profile such that a top region of the p-type semiconductor layer is less heavily p-doped than bottom region of the p-type semiconductor layer.

7. The single transistor unit of claim 5 wherein the first and second n-type semiconductor layers have a p-plus doping.

8. The single transistor unit of claim 5 wherein the semiconductor region comprises polysilicon.

9. The single transistor unit of claim 5 wherein the first n-type semiconductor layer is formed on an insulator base.

10. The single transistor unit of claim 9 wherein the insulator base is oxide.

11. The single transistor unit of claim 5 wherein the first n-type semiconductor layer is formed on a p-type substrate.

12. The single transistor unit of claim 5 further comprising a polysilicon gate contact located laterally adjacent to the p-type semiconductor layer.

13. A single memory cell access transistor unit having an n-channel field effect transistor (FET) and an NPN bipolar transistor, the single transistor unit comprising:

a first n-type semiconductor region which forms both an emitter of the n-channel FET and a collector of the NPN bipolar transistor, a p-type semiconductor region located above the first n-type semiconductor region which forms a body of the n-channel FET and a base of the NPN bipolar transistor;

a second n-type semiconductor region located above the p-type semiconductor region which forms a drain of the n-channel FET and a collector of the NPN bipolar transistor;

a semiconductor region located laterally adjacent to the p-type semiconductor region, the semiconductor region is laterally spaced from the p-type semiconductor region by an insulator such that the semiconductor region forms a gate of the n-channel FET.

14. The single memory cell access transistor unit of claim 13 wherein a memory cell coupled to the second n-type semiconductor region is written by coupling a low voltage to the p-type semiconductor region and a high voltage is coupled to the semiconductor region.

15. The single memory cell access transistor unit of claim 14 wherein the low voltage is approximately 0.7 volts and the high voltage is approximately 3.0 volts.

16. The single memory cell access transistor unit of claim 13 wherein a memory cell coupled to the second n-type semiconductor region is read by coupling a high voltage to the p-type semiconductor region and a low voltage is coupled to the semiconductor region.

17. The single memory cell access transistor unit of claim 16 wherein the high voltage is approximately 1.6 volts and the low voltage is approximately zero volts.

* * * * *